US012593653B2

(12) United States Patent
Son

(10) Patent No.: US 12,593,653 B2
(45) Date of Patent: Mar. 31, 2026

(54) TRANSFER UNIT AND SUBSTRATE TREATMENT APPARATUS INCLUDING THE SAME

(71) Applicant: SEMES CO., LTD., Cheonan-si (KR)

(72) Inventor: Duk Hyun Son, Cheonan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 313 days.

(21) Appl. No.: 18/189,285

(22) Filed: Mar. 24, 2023

(65) Prior Publication Data

US 2024/0203776 A1 Jun. 20, 2024

(30) Foreign Application Priority Data

Dec. 15, 2022 (KR) ........................ 10-2022-0176184

(51) Int. Cl.
| | |
|---|---|
| *H01L 21/677* | (2006.01) |
| *B25J 11/00* | (2006.01) |
| *B25J 15/00* | (2006.01) |
| *B25J 15/06* | (2006.01) |
| *H01L 21/687* | (2006.01) |

(52) U.S. Cl.
CPC ..... *H01L 21/67766* (2013.01); *B25J 11/0095* (2013.01); *B25J 15/0014* (2013.01); *B25J 15/0616* (2013.01); *H01L 21/67742* (2013.01); *H01L 21/68707* (2013.01); *Y10S 414/141* (2013.01); *Y10S 901/40* (2013.01)

(58) Field of Classification Search
None
See application file for complete search history.

(56) References Cited

U.S. PATENT DOCUMENTS

| | | | |
|---|---|---|---|
| 2015/0008688 A1* | 1/2015 | Furuichi | ............. B25J 15/0683 294/183 |
| 2019/0355605 A1* | 11/2019 | Hudgens | ........... H01L 21/67167 |
| 2020/0273826 A1* | 8/2020 | Kroetz | ............. H01L 21/67011 |

FOREIGN PATENT DOCUMENTS

| JP | 2003191191 A | * | 7/2003 |
|---|---|---|---|
| JP | 2004-165276 A | | 6/2004 |
| KR | 10-0837737 | | 6/2008 |
| KR | 10-1140589 | | 5/2012 |
| KR | 10-2017-0056988 A | | 5/2017 |

(Continued)

OTHER PUBLICATIONS

Funato, "Vacuum Suction Device", Jul. 2003 all pages. (Year: 2003).*

(Continued)

*Primary Examiner* — Michael S Lowe
(74) *Attorney, Agent, or Firm* — Harness, Dickey & Pierce, P.L.C.

(57) ABSTRACT

Provided are a transfer unit and a substrate treatment apparatus which can stably vacuum-adsorb a substrate and can be used for a long time. The transfer unit includes: a robot arm; and an end effector connected to the robot arm, wherein the end effector includes: a body; a vacuum hole formed in the body; and a pad installed on the body to surround the vacuum hole and including a first pad layer and a second pad layer stacked sequentially, wherein the first pad layer has greater elasticity than the second pad layer, and the second pad layer has greater hardness than the first pad layer.

17 Claims, 10 Drawing Sheets

51

(56)          References Cited

FOREIGN PATENT DOCUMENTS

| | | |
|---|---|---|
| KR | 10-2322129 | 11/2021 |
| KR | 10-2022-0058146  A | 5/2022 |

OTHER PUBLICATIONS

Mori, "Suction Hand", all pages, Sep. 1996 figures. (Year: 1996).*
Office Action for Korean Application No. 10-2022-0176184 dated Jun. 27, 2024.

* cited by examiner

FIG. 3

TRANSFER UNIT AND SUBSTRATE TREATMENT APPARATUS INCLUDING THE SAME

This application claims the benefit of Korean Patent Application No. 10-2022-0176184, filed on Dec. 15, 2022, in the Korean Intellectual Property Office, the disclosure of which is incorporated herein in its entirety by reference.

BACKGROUND

1. Field

The present disclosure relates to a transfer unit and a substrate treatment apparatus including the same.

2. Description of the Related Art

When a semiconductor device or a display device is manufactured, various processes such as photolithography, etching, ashing, ion implantation, thin-film deposition, and cleaning are performed. In order to perform these processes, a substrate is transferred by a transfer unit. For example, the transfer unit may pick up and transfer the substrate using a vacuum adsorption method.

SUMMARY

Aspects of the present disclosure provide a transfer unit which can stably vacuum-adsorb a substrate and can be used for a long time.

Aspects of the present disclosure also provide a substrate treatment apparatus including the transfer unit.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of the present disclosure, there is provided a transfer unit including: a robot arm; and an end effector connected to the robot arm, wherein the end effector includes: a body; a vacuum hole formed in the body; and a pad installed on the body to surround the vacuum hole and including a first pad layer and a second pad layer stacked sequentially, wherein the first pad layer has greater elasticity than the second pad layer, and the second pad layer has greater hardness than the first pad layer.

According to another aspect of the present disclosure, there is a transfer unit comprising: a robot arm; and an end effector connected to the robot arm, wherein the end effector comprises: a body; a vacuum hole formed in the body; and a pad installed on the body to surround the vacuum hole and comprising a first pad layer and a second pad layer stacked sequentially, wherein the first pad layer is formed on the body, a lower surface of the second pad layer directly contacts the first pad layer, an upper surface of the second pad layer directly contacts a substrate, the first pad layer has greater elasticity than the second pad layer, the second pad layer has greater hardness than the first pad layer, a width of the first pad layer is greater than a width of the second pad layer, the second pad layer is formed along an outer edge of the first pad layer, and the first pad layer and the second pad layer have an elliptical shape.

According to an aspect of the present disclosure, there is a substrate treatment apparatus comprising: an index module comprising a load port on which a container having a substrate accommodated therein is placed and an index robot for transferring the substrate; and a process module comprising a process chamber and a main transfer robot transferring the substrate to the process chamber, wherein the index robot or the main transfer robot comprises a robot arm and an end effector connected to the robot arm, and the end effector comprises a body, a vacuum hole formed in the body, and a pad installed on the body to surround the vacuum hole and comprising a first pad layer and a second pad layer stacked sequentially, wherein the first pad layer has greater elasticity than the second pad layer, and the second pad layer has greater hardness than the first pad layer.

BRIEF DESCRIPTION OF THE DRAWINGS

These and/or other aspects will become apparent and more readily appreciated from the following description of the embodiments, taken in conjunction with the accompanying drawings in which:

FIG. 3 is a cross-sectional view of area A of FIG. 1;

DETAILED DESCRIPTION

Figure 1:
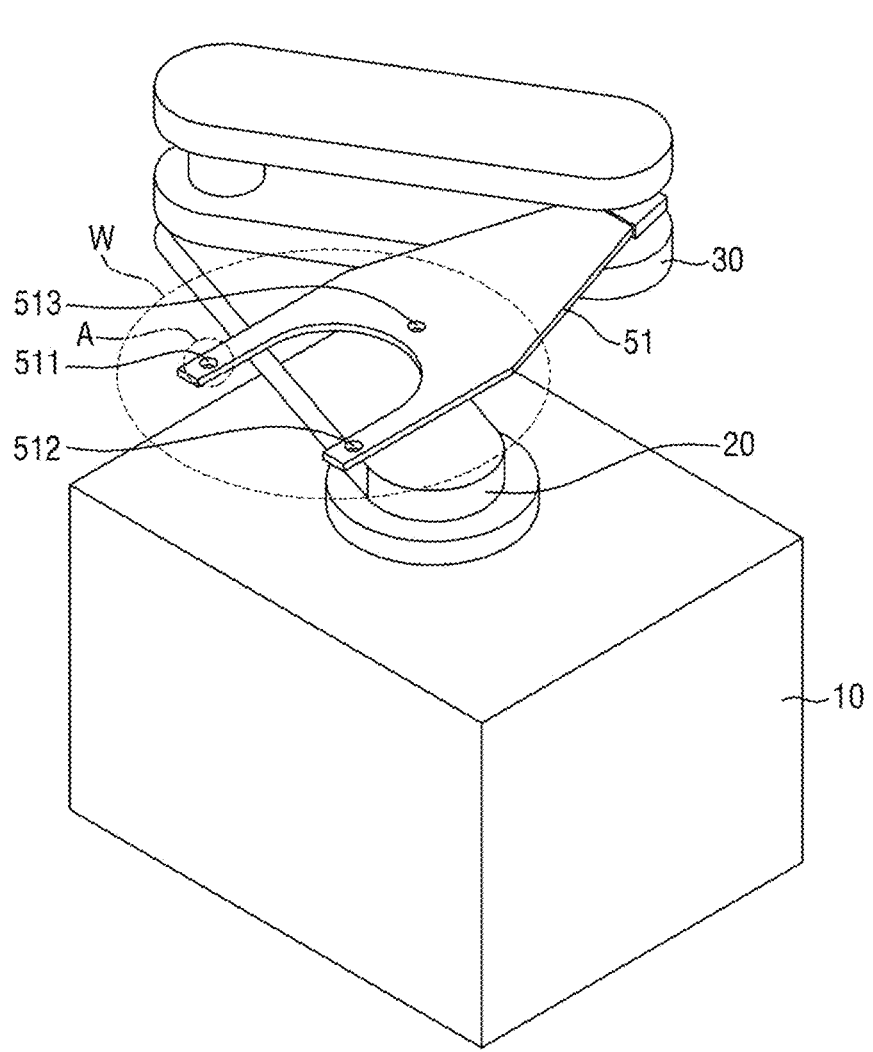
FIG. 1 is a perspective view of a transfer unit according to embodiments of the present disclosure.

Hereinafter, exemplary embodiments of the present disclosure will be described in greater detail with reference to the attached drawings. Advantages and features of the present disclosure and methods of accomplishing the same may be understood more readily by reference to the following detailed description of exemplary embodiments and the accompanying drawings. The present disclosure may, however, be embodied in many different forms and should not be construed as being limited to the embodiments set forth herein. Rather, these embodiments are provided so that this disclosure will be thorough and complete and will fully convey the concept of the invention to those skilled in the art, and the present disclosure will only be defined by the appended claims. Like reference numerals refer to like elements throughout the specification.

Spatially relative terms, such as "below," "beneath," "lower," "above," "upper" and the like, may be used herein for ease of description to describe the relationship of one element or component to another element(s) or component(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the exemplary term "below" or "beneath" can encompass both an orientation of above and below. The device may be otherwise oriented and the spatially relative descriptors used herein interpreted accordingly.

It will be understood that, although the terms first, second, third, etc., may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of the present disclosure.

Hereinafter, embodiments of the present disclosure will be described in detail with reference to the attached drawings. In the following description with reference to the attached drawings, like or corresponding elements will be indicated by like reference numerals, and a redundant description thereof will be omitted.

Figure 2:
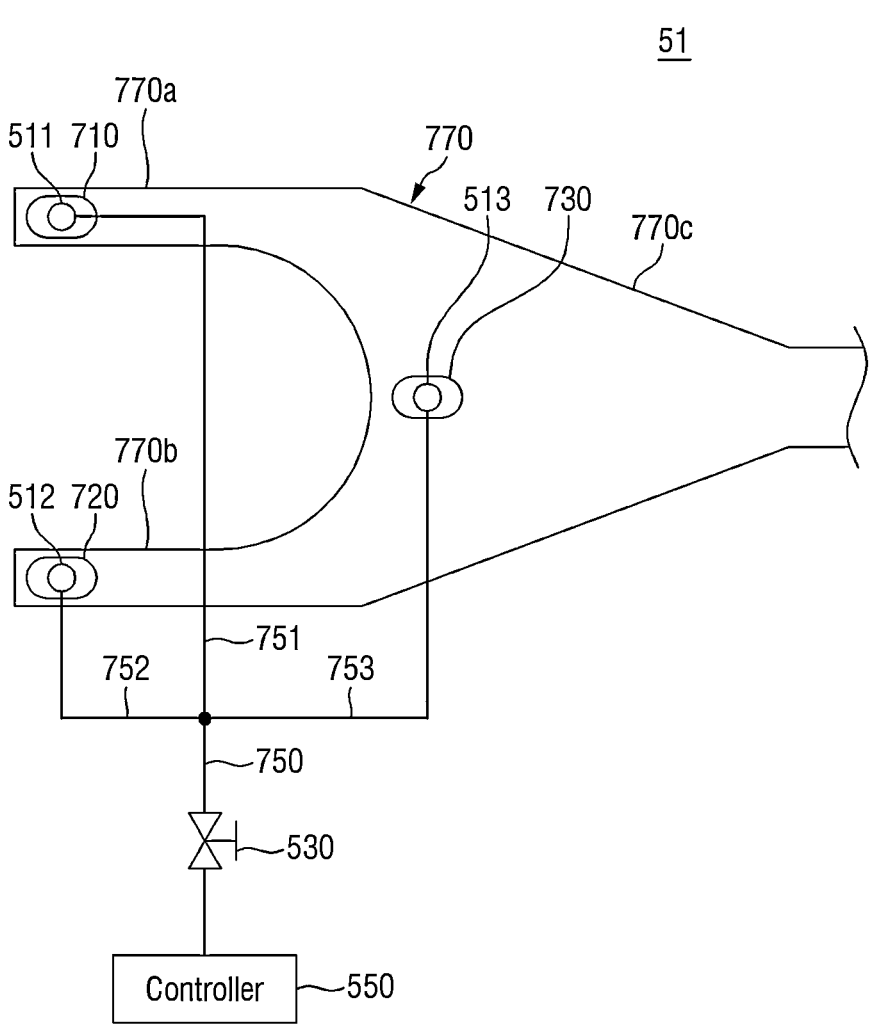
FIG. 2 is a conceptual diagram for explaining the transfer unit of FIG. 1.
Figure 3:
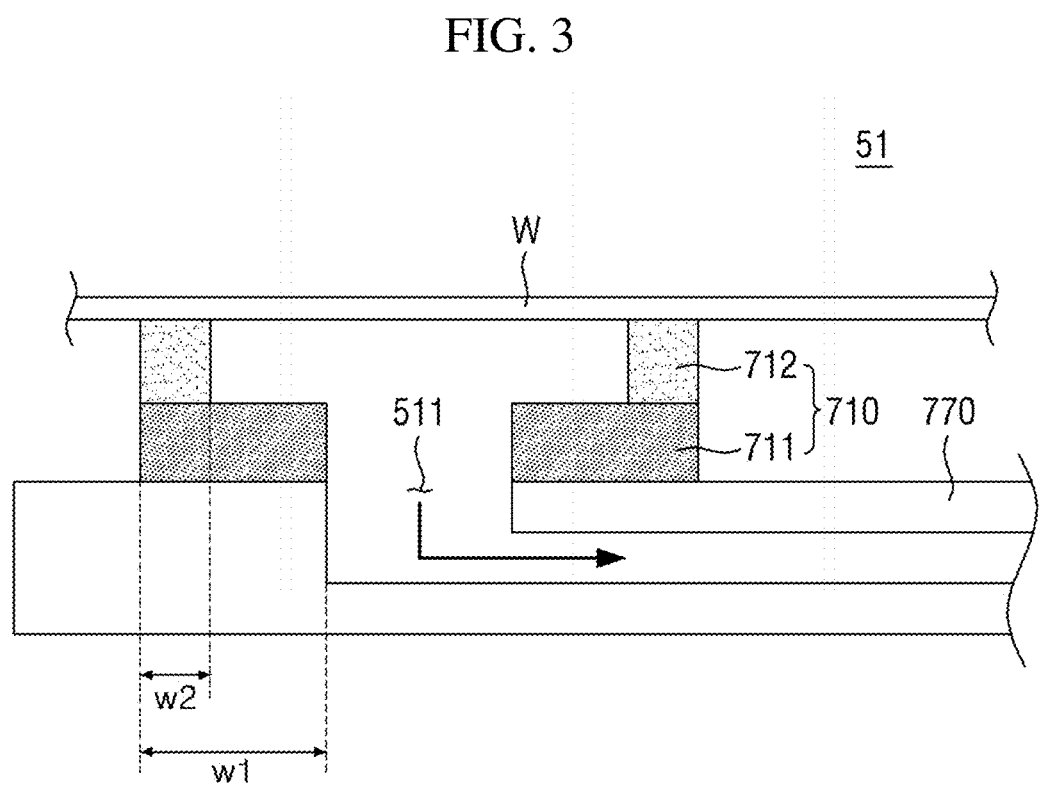
Figure 4:
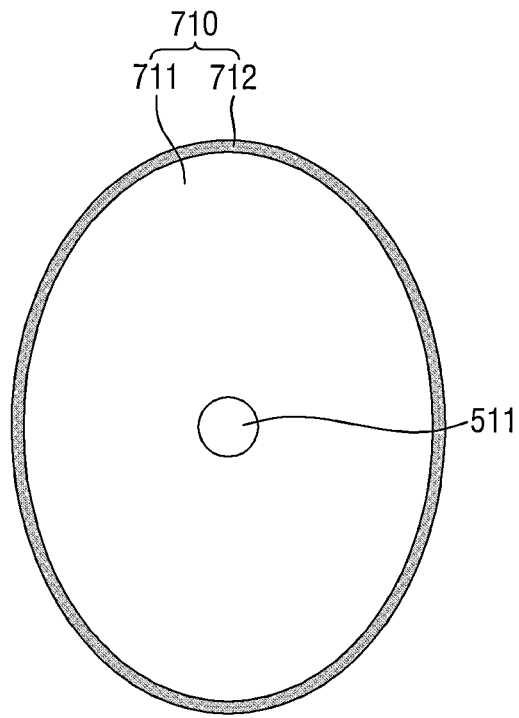
FIG. 4 is a plan view illustrating the configuration of a pad illustrated in FIGS. 2 and 3.

FIG. 1 is a perspective view of a transfer unit according to embodiments of the present disclosure. FIG. 2 is a conceptual diagram for explaining the transfer unit of FIG. 1. FIG. 3 is a cross-sectional view of area A of FIG. 1. FIG. 4 is a plan view illustrating the configuration of a pad illustrated in FIGS. 2 and 3.

First, referring to FIG. 1, the transfer unit according to the embodiments of the present disclosure includes a robot arm 20 and 30 mounted on a housing 10 and an end effector 51 installed on the robot arm 20 and 30.

The housing 10 is a member for supporting the robot arm 20 and 30. The housing 10 may be fixed or may be moved by a moving mechanism (e.g., a rail).

The robot arm 20 and 30 includes a base arm 20 connected onto the housing 10 and a front arm 30 fastened to a front end of the base arm 20. Although the robot arm 20 and 30 has two joints in the drawing, the present disclosure is not limited thereto. For example, the robot arm 20 and 30 may also have only one joint or three or more joints.

The end effector 51 is rotatably fastened to a front end of the front arm 30. The end effector 51 is also called a hand. The end effector 51 may be disposed under a substrate W to adsorb and fix the substrate W using a vacuum method.

The transfer unit moves the substrate W from a first location (e.g., an index module) to a second location (e.g., a load lock module).

Referring to FIG. 2, the end effector 51 includes a body 770, vacuum holes 511, 512 and 513, and pads 710, 720 and 730.

The body 770 may have a substantially flat upper surface. In addition, the body 770 has two fingers 770a and 770b spaced apart from each other as illustrated in the drawing. However, the present disclosure is not limited thereto, and the body 770 may also be composed of one finger or three or more fingers spaced apart from each other.

A plurality of vacuum holes 511, 512 and 513 are formed in the body 770. For example, the vacuum holes 511, 512 and 513 may include a first vacuum hole 511 installed in a first finger 770a on one side, a second vacuum hole 512 installed in a second finger 770b on the other side, and a third vacuum hole 513 installed in a connection portion 770c connecting the first finger 770a and the second finger 770b. Positions where the vacuum holes 511, 512 and 513 are installed are not limited to those illustrated in the drawing.

A controller 550 is connected to the vacuum holes 511, 512 and 513 through a main line 750 and a plurality of branch lines 751, 752 and 753.

For example, the controller 550 is connected to the main line 750, and the main line 750 is divided into a first branch line 751, a second branch line 752 and a third branch line 753 at a specific branch point. The first branch line 751 is connected to the first vacuum hole 511, the second branch line 752 is connected to the second vacuum hole 512, and the third branch line 753 is connected to the third vacuum hole 513.

A valve 530 may be installed in the main line 750, and vacuum adsorption provided to the vacuum holes 511, 512 and 513 may be adjusted according to on/off of the valve 30. Unlike in the drawing, a valve may also be installed in each of the branch lines 751, 752 and 753 to adjust vacuum adsorption provided to each of the vacuum holes 511, 512 and 513.

Although the controller 550 has been described as being able to adjust the pressure of each vacuum hole by turning on/off the valve 530, the present disclosure is not limited thereto. Vacuum adsorption may also be controlled using a component other than a valve. Referring to FIGS. 3 and 4, the pad 710 is installed to surround the vacuum hole 511 of the body 770 and includes a first pad layer 711 and a second pad layer 712 stacked sequentially.

An upper surface of the second pad layer 712 may directly contact the substrate W and may be worn down when the pad 710 is used for a long time. Therefore, a material having high hardness may be used for the second pad layer 712 in order to minimize surface abrasion.

As described above, the second pad layer 712 uses a material having high hardness. However, the material having high hardness may have poor adsorptive power during vacuum adsorption due to lack of elasticity. Therefore, the first pad layer 711 under the second pad layer 712 may use a material having relatively high elasticity to compensate for insufficient elasticity of the second pad layer 712.

Consequently, the first pad layer 711 has greater elasticity than the second pad layer 712, and the second pad layer 712 has greater hardness than the first pad layer 711.

As for the materials of the first pad layer 711 and the second pad layer 712 having these characteristics, the first pad layer 711 may include, for example, Teflon or silicon. The second pad layer 712 may include, for example, polyether ether ketone (PEEK) or carbon PEEK.

Additionally, the first pad layer 711 and the second pad layer 712 may have conductivity. For example, the first pad layer 711 and the second pad layer 712 may include conductive pellets. Since the first pad layer 711 and the second pad layer 712 include conductive pellets, when static electricity is generated, the static electricity may be removed through the first pad layer 711 and the second pad layer 712.

In addition, as illustrated in FIG. 4, the pad 710 (in particular, the second pad layer 712) may have an elliptical shape. This is because the elliptical pad 710 is more advantageous during vacuum breaking than a circular pad.

In addition, as illustrated in FIG. 3, a width w1 of the first pad layer 711 is greater than a width w2 of the second pad layer 712. The area of the substrate W that can be adsorbed by vacuum can be maximized by relatively increasing the width w1 of the first pad layer 711. A physical contact area between the substrate W and the second pad layer 712 can be minimized by making the width w2 of the second pad layer 712 relatively small.

The pad 710 configured as described above can stably adsorb and fix the substrate W while preventing the substrate W and the second pad layer 712 from sticking together. The substrate W is easily separated from the second pad layer 712 during vacuum breaking.

As illustrated, the second pad layer 712 may be formed on the first pad layer 711 along an outer edge of the first pad layer 711, but the present disclosure is not limited thereto. The pad 710 configured as described above can adjust the physical contact area between the substrate W and the second pad layer 712 while keeping a large area of the substrate W adsorbed by vacuum in a limited area.

Although the vacuum hole 511 and the pad 710 have been described with reference to FIGS. 3 and 4, substantially the same description can be applied to the other vacuum holes 512 and 513 and the other pads 720 and 730.

In addition, although the pad 710 is composed of two pad layers 711 and 712 in the drawings, the present disclosure is not limited thereto. For example, the pad 710 may also be composed of three or more pad layers. For example, a third pad layer having an elastic value between an elastic value of the first pad layer 711 and an elastic value of the second pad layer 712 may be disposed between the first pad layer 711 and the second pad layer 712.

Figure 5:
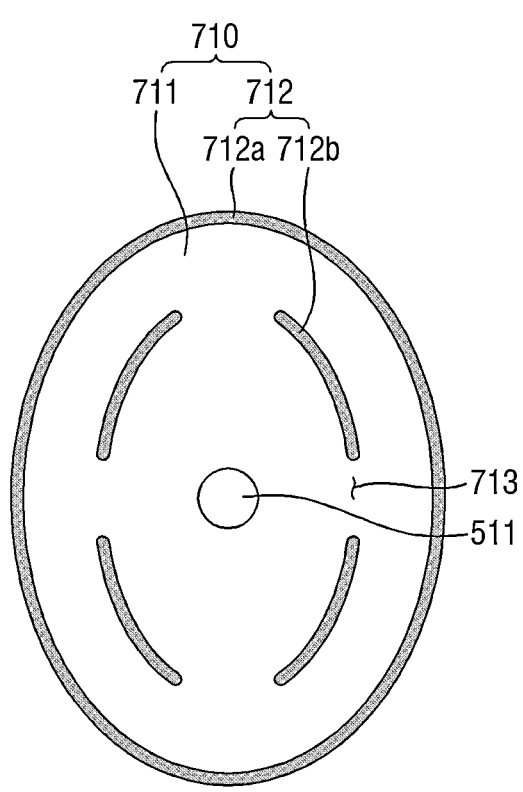
FIGS. 5 through 7 are plan views illustrating examples of pads used in the transfer unit according to the embodiments of the present disclosure.
Figure 6:
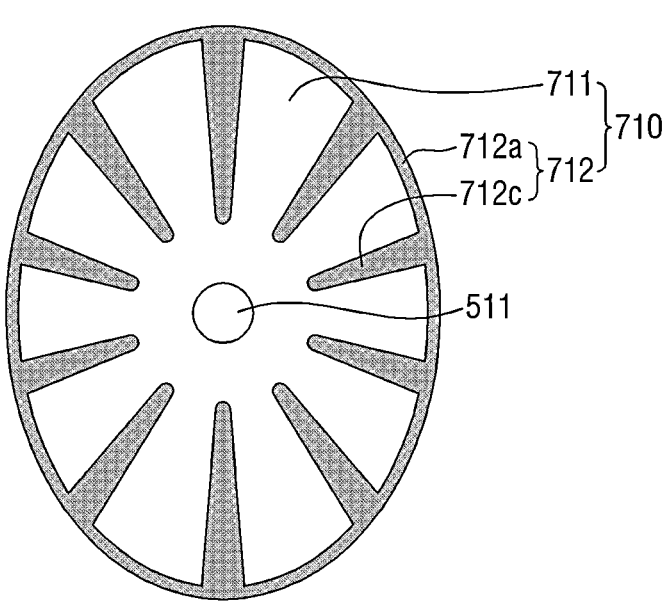
Figure 7:
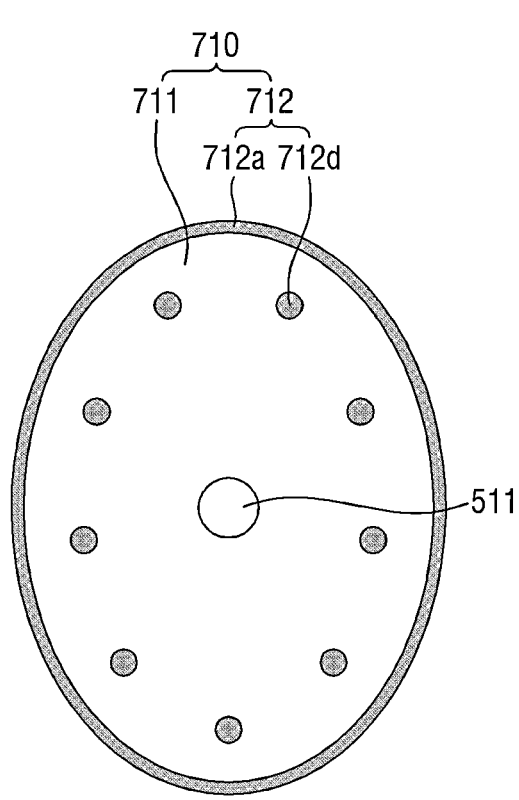

FIGS. 5 through 7 are plan views of pads 710 used in the transfer unit according to the embodiments of the present disclosure. For ease of description, differences from elements and features described using FIGS. 1 through 4 will be mainly described below.

Referring to FIGS. 5 through 7, a second pad layer 712 of a pad 710 includes a first portion 712*a* formed in an elliptical shape and a second portion 712*b*, 712*c* or 712*d* disposed between the first portion 712*a* and a vacuum hole 511. The first portion 712*a* and the second portion 712*b*, 712*c* or 712*d* physically contact a substrate W. When it is determined through simulation that a vacuum effect is poor due to an insufficient physical contact area with the substrate W, the physical contact area with the substrate W may be increased by using the second portion 712*b*, 712*c* or 712*d*. The second portion 712*b*, 712*c* or 712*d* may have various shapes as illustrated in FIGS. 5 through 7, but the present disclosure is not limited thereto.

As illustrated in FIG. 5, the second portion 712*b* may have an elliptical shape. Apertures 713 are formed in the second portion 712*b* so that a vacuum can be created not only in an area inside the second portion 712*b* but also between the first portion 712*a* and the second portion 712*b*.

As illustrated in FIG. 6, the second pad layer 712 of the pad 710 includes the first portion 712*a* formed in an elliptical shape and the second portion 712*c* extending from the first portion 712*a* toward the vacuum hole 511.

As illustrated in FIG. 7, the second pad layer 712 of the pad 710 includes the first portion 712*a* formed in an elliptical shape and the second portion 712*d* spaced apart from the first portion 712*a* and shaped like islands.

Figure 8:
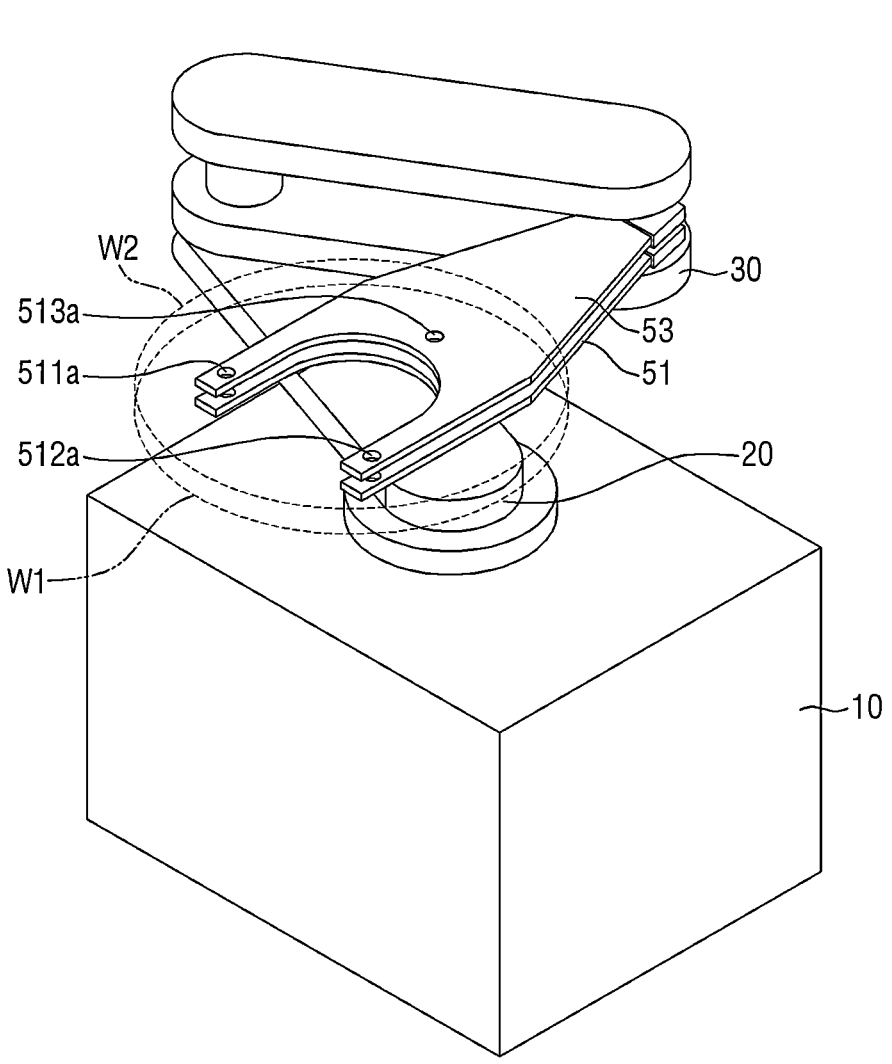
FIG. 8 is a perspective view of a transfer unit according to an embodiment of the present disclosure.

FIG. 8 is a perspective view of a transfer unit according to an embodiment of the present disclosure. For ease of description, differences from elements and features described using FIGS. 1 through 4 will be mainly described below.

Referring to FIG. 8, the transfer unit according to the embodiment of the present disclosure includes a robot arm 20 and 30 mounted on a housing 10 and a plurality of end effectors 51 and 53 installed on the robot arm 20 and 30. A lower end effector 51 supports a substrate W1, and an upper end effector 53 supports a substrate W2.

As described above, vacuum holes (see 511, 512 and 513 in FIG. 2) and pads (see 710, 720 and 730 in FIG. 2) may be formed in the end effector 51. Vacuum holes 511*a*, 512*a* and 513*a* and pads (not illustrated) may be formed in the end effector 53. The end effectors 51 and 53 may be enabled by the robot arm 20 and 30 to pick up the substrates W1 and W2 or place the substrates W1 and W2, respectively.

Figure 9:
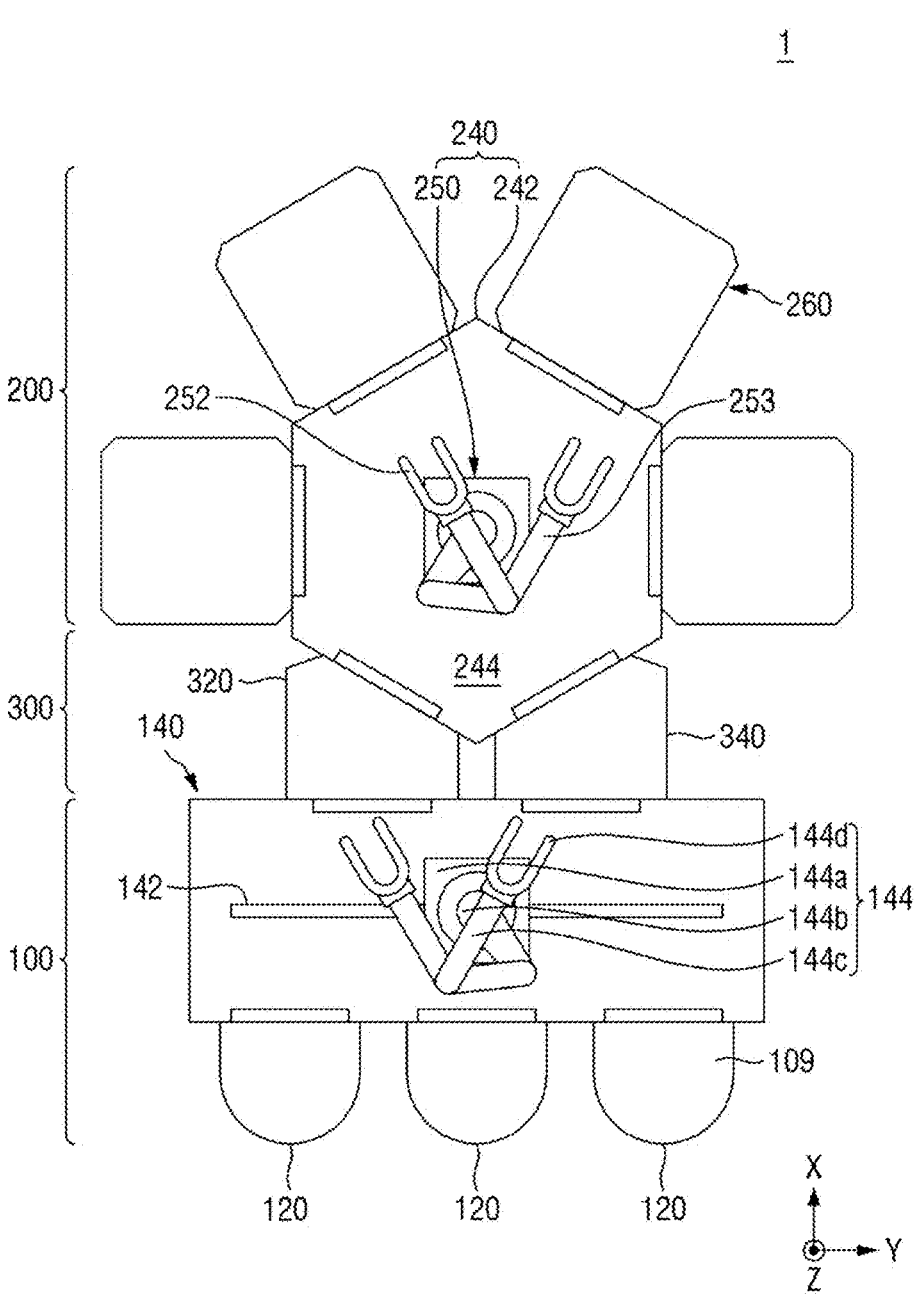
FIG. 9 is a conceptual diagram illustrating a substrate treatment apparatus according to embodiments of the present disclosure.

FIG. 9 is a conceptual diagram illustrating a substrate treatment apparatus 1 according to embodiments of the present disclosure.

Referring to FIG. 9, the substrate treatment apparatus 1 according to the embodiments of the present disclosure includes an index module 100, a load lock module 300, and a process module 200. A direction in which the index module 100, the load lock module 300, and the process module 200 are arranged is a first direction X, a direction perpendicular to the first direction X when viewed from above is a second direction Y, and a direction perpendicular to a plane including the first direction X and the second direction Y is a third direction Z.

The index module 100 includes load ports 120 and a transport frame 140.

A container 109 in which a plurality of substrates W are accommodated is placed on each of the load ports 120. A plurality of load ports 120 are arranged in a row along the second direction Y. Although three load ports 120 are illustrated in FIG. 9, the present disclosure is not limited thereto. The number of load ports 120 may increase or decrease depending on conditions such as process efficiency and footprint of the process module 200. The container 109 may be, but is not limited to, a front opening unified pod (FOUP).

The transport frame 140 transfers the substrates W between the containers 109 placed on the load ports 120 and the load lock module 300. The transport frame 140 includes an index rail 142 and an index robot 144. A longitudinal direction of the index rail 142 may be parallel to the second direction Y. The index robot 144 may be installed on the index rail 142 and may move in a straight line in the second direction Y along the index rail 142. The index robot 144 includes a housing 144*a*, a robot arm 144*b* and 144*c*, and end effectors 144*d*. The housing 144*a* is installed to be movable along the index rail 142. The robot arm 144*b* and 144*c* is rotatable in the housing 144*a* and is provided to move forward/backward with respect to the housing 144*a*. The end effectors 144*d* may adsorb and move the substrates W using a vacuum method.

The load lock module 300 is disposed between the transport frame 140 and a transfer unit 240. The load lock module 300 replaces a normal pressure atmosphere of the index module 100 with a vacuum atmosphere of the process module 200 for a substrate W input to the process module 200 or replaces the vacuum atmosphere of the process module 200 with the normal pressure atmosphere of the index module 100 for a substrate W output to the index module 100. The load lock module 300 provides a space where a substrate W stays before it is transferred between the transfer unit 240 and the transport frame 140. The load lock module 300 includes a load lock chamber 320 and an unload lock chamber 340.

In the load lock chamber 320, a substrate W transferred from the index module 100 to the process module 200 temporarily stays. In a standby state, the load lock chamber 320 maintains a normal pressure atmosphere and is kept open to the index module 100 while being blocked from the process module 200. When a substrate W is loaded into the load lock chamber 320, the internal space of the load lock chamber 320 is sealed from each of the index module 100 and the process module 200. Then, the internal space of the load lock chamber 320 is changed from the normal pressure atmosphere to a vacuum atmosphere, and the load lock chamber 320 is opened to the process module 200 while being blocked from the index module 100.

In the unload lock chamber 340, a substrate W transferred from the process module 200 to the index module 100 temporarily stays. In a standby state, the unload lock chamber 340 maintains a vacuum atmosphere and is kept open to the process module 200 while being blocked from the index module 100. When a substrate W is loaded into the unload lock chamber 340, the internal space of the unload lock chamber 340 is sealed from each of the index module 100 and the process module 200. Then, the internal space of the unload lock chamber 340 is changed from the vacuum atmosphere to a normal pressure atmosphere, and the unload lock chamber 340 is opened to the index module 100 while being blocked from the process module 200.

The process module 200 includes the transfer unit 240 and a plurality of process chambers 260.

The transfer unit 240 transfers the substrates W between the load lock chamber 320, the unload lock chamber 340, and the process chambers 260. The transfer unit 240 includes a transfer chamber 242 and a main transfer robot 250. The transfer chamber 242 may be provided in a hexagonal shape, but the present disclosure is not limited thereto. Optionally, the transfer chamber 242 may be square, rectangular or pentagonal in shape.

The load lock chamber 320, the unload lock chamber 340, and the process chambers 260 are positioned around the transfer chamber 242. A transfer space 244 for transferring the substrates W is provided inside the transfer chamber 242.

The main transfer robot 250 transfers the substrates W in the transfer space 244. The main transfer robot 250 may be located in a central portion of the transfer chamber 242, but the present disclosure is not limited thereto. The main transfer robot 250 includes at least one robot arm 253 and at least one hand 252 (i.e., end effector). One or more hands 252 may move in horizontal and vertical directions and may move forward/backward or rotate on a horizontal plane. The hands 252 may be driven independently, and the substrates W may be placed horizontally on the hands 252.

In the process chambers 260, for example, substrate treatment using plasma may be performed. For example, an etching process, an ashing process, a drying process, and the like may be performed. Alternatively, a process performed in the process chambers 260 may be a substrate treatment process using a gas rather than a substrate treatment process using plasma.

As the main transfer robot 250 or the index robot 144, one of the transfer units described with reference to FIGS. 1 through 8 may be used.

Figure 10:
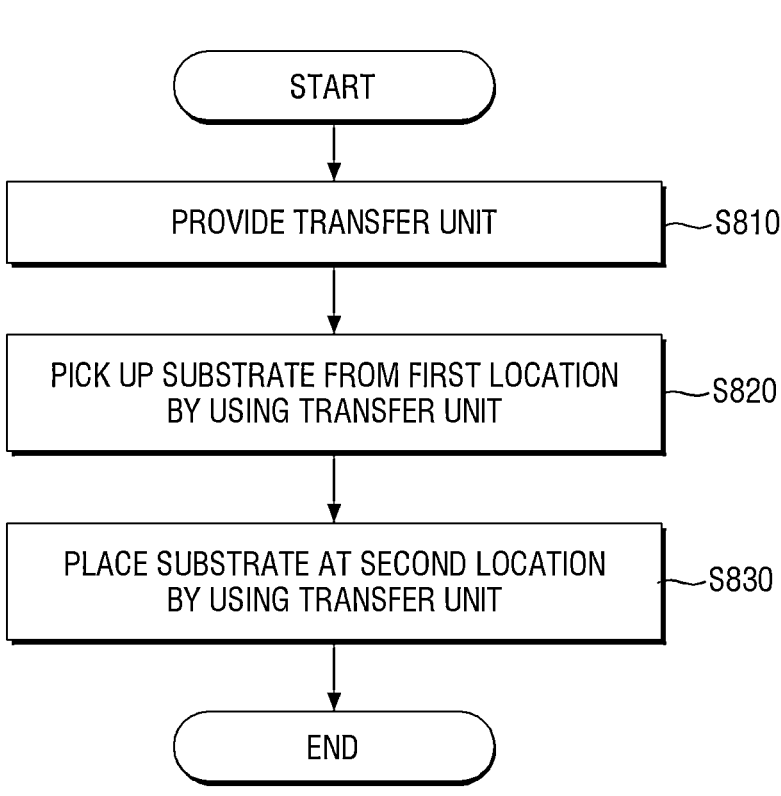
FIG. 10 is a flowchart illustrating a substrate treatment method according to embodiments of the present disclosure.

FIG. 10 is a flowchart illustrating a substrate treatment method according to embodiments of the present disclosure.

Referring to FIG. 10, first, a transfer unit is provided (operation S810).

Specifically, the transfer unit may be one of the transfer units of FIGS. 1 through 8. For example, the transfer unit includes a body, a vacuum hole formed in the body, and a pad installed on the body to surround the vacuum hole and including a first pad layer and a second pad layer stacked sequentially. Here, the first pad layer has greater elasticity than the second pad layer, and the second pad layer has greater hardness than the first pad layer. For example, the first pad layer may include Teflon or silicon, and the second pad layer may include PEEK or carbon PEEK. A width of the first pad layer may be greater than a width of the second pad layer, and the second pad layer may be formed on the first pad layer along an outer edge of the first pad layer.

The first pad layer and the second pad layer may have an elliptical shape.

Next, the transfer unit picks up a substrate from a first location (operation S820). The transfer unit places the substrate at a second location (operation S830).

Specifically, the transfer unit picks up a substrate from the first location (e.g., a load port 120 of FIG. 9) and places the substrate at the second location (e.g., the load lock chamber 320 of FIG. 9).

Alternatively, the transport unit picks up a substrate from the first location (e.g., the load lock chamber 320 of FIG. 9) and places the substrate at the second location (e.g., a process chamber 260 of FIG. 9).

Alternatively, the transfer unit picks up a substrate from the first location (e.g., a process chamber 260 of FIG. 9) and places the substrate at the second location (e.g., the unload lock chamber 340 of FIG. 9).

While the present disclosure has been particularly illustrated and described with reference to exemplary embodiments thereof, it will be understood by those of ordinary skill in the art that various changes in form and detail may be made therein without departing from the spirit and scope of the present disclosure as defined by the following claims. The exemplary embodiments should be considered in a descriptive sense only and not for purposes of limitation.

What is claimed is:

1. A transfer unit comprising:
   a robot arm; and
   an end effector connected to the robot arm,
   wherein the end effector comprises:
      a body;
      a vacuum hole formed in the body; and
      a pad installed on the body to surround the vacuum hole and comprising a first pad layer and a second pad layer stacked sequentially,
      wherein the first pad layer has greater elasticity than the second pad layer, and the second pad layer has greater hardness than the first pad layer, and
   wherein the second pad layer comprises
      a first portion along an outer edge of the first pad layer, and
      a second portion between the first portion and the vacuum hole, the first portion and the second portion both configured to physically contact a substrate on the pad.

2. The transfer unit of claim 1, wherein the first pad layer comprises Teflon or silicon.

3. The transfer unit of claim 2, wherein the second pad layer comprises polyether ether ketone (PEEK) or carbon PEEK.

4. The transfer unit of claim 1, wherein the first pad layer and the second pad layer comprise a conductive material, so that static electricity is removed through the first pad layer and the second pad layer.

5. The transfer unit of claim 1, wherein the pad is installed in an elliptical shape.

6. The transfer unit of claim 1, wherein a width of the first pad layer is greater than a width of the second pad layer.

7. The transfer unit of claim 1, wherein the first portion is in an elliptical shape on the first pad layer.

8. The transfer unit of claim 1, wherein the second portion is connected to the first portion and extends from the first portion toward the vacuum hole.

9. The transfer unit of claim 1, wherein the second portion is spaced apart from the first portion and formed in an island shape.

10. A transfer unit comprising:

a robot arm; and an end effector connected to the robot arm, wherein the end effector comprises:

a body;

a vacuum hole formed in the body; and a pad installed on the body to surround the vacuum hole and comprising a first pad layer and a second pad layer stacked sequentially, wherein the first pad layer is formed on the body, a lower surface of the second pad layer directly contacts the first pad layer, an upper surface of the second pad layer directly contacts a substrate, the first pad layer has greater elasticity than the second pad layer, the second pad layer has greater hardness than the first pad layer, a width of the first pad layer is greater than a width of the second pad layer, the second pad layer is formed along an outer edge of the first pad layer, and the first pad layer and the second pad layer have an elliptical shape, and wherein the second pad layer comprises a first portion along the outer edge of the first pad layer, and a second portion between the first portion and the vacuum hole, the first portion and the second portion both configured to physically contact a substrate on the pad.

11. The transfer unit of claim 10, wherein the first pad layer comprises Teflon or silicon, and the second pad layer comprises PEEK or carbon PEEK.

12. A substrate treatment apparatus comprising:

an index module comprising a load port on which a container having a substrate accommodated therein is placed and an index robot for transferring the substrate; and a process module comprising a process chamber and a main transfer robot transferring the substrate to the process chamber, wherein the index robot or the main transfer robot comprises a robot arm and an end effector connected to the robot arm, and the end effector comprises a body, a vacuum hole formed in the body, and a pad installed on the body to surround the vacuum hole and comprising a first pad layer and a second pad layer stacked sequentially, wherein the first pad layer has greater elasticity than the second pad layer, and the second pad layer has greater hardness than the first pad layer, and wherein the second pad layer comprises a first portion along an outer edge of the first pad layer, and a second portion between the first portion and the vacuum hole, the first portion and the second portion both configured to physically contact a substrate on the pad.

13. The substrate treatment apparatus of claim 12, wherein the first pad layer comprises Teflon or silicon.

14. The substrate treatment apparatus of claim 13, wherein the second pad layer comprises PEEK or carbon PEEK.

15. The substrate treatment apparatus of claim 12, wherein the first pad layer and the second pad layer comprise a conductive material, so that static electricity is removed through the first pad layer and the second pad layer.

16. The substrate treatment apparatus of claim 12, wherein the pad is installed in an elliptical shape.

17. The substrate treatment apparatus of claim 12, wherein the first portion is in an elliptical shape on the first pad layer.

* * * * *